US007445496B2

(12) United States Patent
Kao

(10) Patent No.: US 7,445,496 B2
(45) Date of Patent: Nov. 4, 2008

(54) METHOD FOR CONTACTING FLEXIBLE PRINTED CIRCUIT WITH ANOTHER FLEXIBLE CIRCUITRY COMPONENT AND RELATED CIRCUITRY ASSEMBLY

(75) Inventor: Shen-Hong Kao, Taipei County (TW)

(73) Assignee: Lite-On Technology Corp., Neihu, Taipei (TW)

( * ) Notice: Subject to any disclaimer, the term of this patent is extended or adjusted under 35 U.S.C. 154(b) by 0 days.

(21) Appl. No.: 11/457,817

(22) Filed: Jul. 17, 2006

(65) Prior Publication Data
US 2007/0224878 A1    Sep. 27, 2007

(30) Foreign Application Priority Data
Mar. 22, 2006    (TW) .............................. 95109900 A

(51) Int. Cl.
*H01R 9/07* (2006.01)
(52) U.S. Cl. ..................................... 439/496
(58) Field of Classification Search ................ 439/496, 439/495, 492, 497, 67, 74; 29/747, 882
See application file for complete search history.

(56) References Cited
U.S. PATENT DOCUMENTS

| | | | | |
|---|---|---|---|---|
| 4,784,615 A | * | 11/1988 | Teng-Hong | 439/496 |
| 5,044,980 A | * | 9/1991 | Krumme et al. | 439/496 |
| 5,378,161 A | * | 1/1995 | Loder | 439/77 |
| 5,702,269 A | * | 12/1997 | Uchida et al. | 439/496 |
| 6,394,833 B1 | * | 5/2002 | Bulmer et al. | 439/393 |
| 7,189,105 B2 | * | 3/2007 | Takaku et al. | 439/497 |

* cited by examiner

*Primary Examiner*—Alexander Gilman
(74) *Attorney, Agent, or Firm*—Winston Hsu

(57) ABSTRACT

A method for connecting a flexible printed circuit (FPC) with a flexible circuitry component containing conducting wires is disclosed. The flexible circuitry component has an uncovered conducting portion. The proposed method includes providing a tenon and a holder with a groove corresponding to the tenon; and utilizing the tenon to wedge the uncovered conducting portion of the flexible circuitry component and a connecting region of the FPC in the groove of the holder to cause that the uncovered conducting portion contacts the connecting region.

24 Claims, 4 Drawing Sheets

METHOD FOR CONTACTING FLEXIBLE PRINTED CIRCUIT WITH ANOTHER FLEXIBLE CIRCUITRY COMPONENT AND RELATED CIRCUITRY ASSEMBLY

BACKGROUND OF THE INVENTION

1. Field of the Invention

The present disclosure relates to techniques for contacting separated circuitry components, and more particularly, to methods for contacting a flexible printed circuit with another flexible circuitry component and related circuitry assemblies.

2. Description of the Prior Art

Many electronic devices and communication products, such as mobile phones, laptop computers, digital cameras, digital videos, or LCD displays, are developed to become lighter, thinner and smaller. In this trend, the flexible printed circuits (FPC) had become more and more important for various applications. In contrast to the conventional printed circuit board, one major advantage of the FPC is that the FPC is flexible. Therefore, the FPC can be disposed freely to match up the shape, size or other design factors of the products thereby reducing the required space.

In order to realize the system functionalities, the active/passive components of the FPC intercommunicate with other circuitry components of the system through flexible flat cables (FFC). In the conventional art, the FPC and FFC can be connected by using a connector. Since the use of the connector increases the overall manufacturing cost, the manufacturers usually adopt hot bar soldering techniques to directly solder the uncovered wires of the FFC onto the connecting region of the FPC. However, the hot bar soldering process is complicated and requires more power consumption. Moreover, the hot bar soldering process results in lower yield rate thereby increasing the manufacturing cost.

SUMMARY OF THE INVENTION

It is therefore an objective of the present disclosure to provide methods for contacting a flexible printed circuit with another flexible circuitry component and related circuitry assemblies without using the hot bar soldering process to solve the above-mentioned problems.

An exemplary embodiment of a method for connecting a flexible printed circuit (FPC) with a flexible circuitry component containing conducting wires is disclosed. The conducting wires have an uncovered conducting portion. The method comprises: providing a tenon and a holder with a groove corresponding to the tenon; and utilizing the tenon to wedge the uncovered conducting portion of the flexible circuitry component and a connecting region of the FPC in the groove of the holder to cause that the uncovered conducting portion contacts the connecting region.

An exemplary embodiment of a circuitry assembly is disclosed comprising: a holder with a groove; a tenon being plugged into the groove; a flexible printed circuit (FPC) comprising a connecting region; and a flexible circuitry component containing conducting wires in which the conducting wires having an uncovered conducting portion; wherein the uncovered conducting portion and the connecting region of the FPC being sandwiched between the tenon and the groove to contact with each other.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
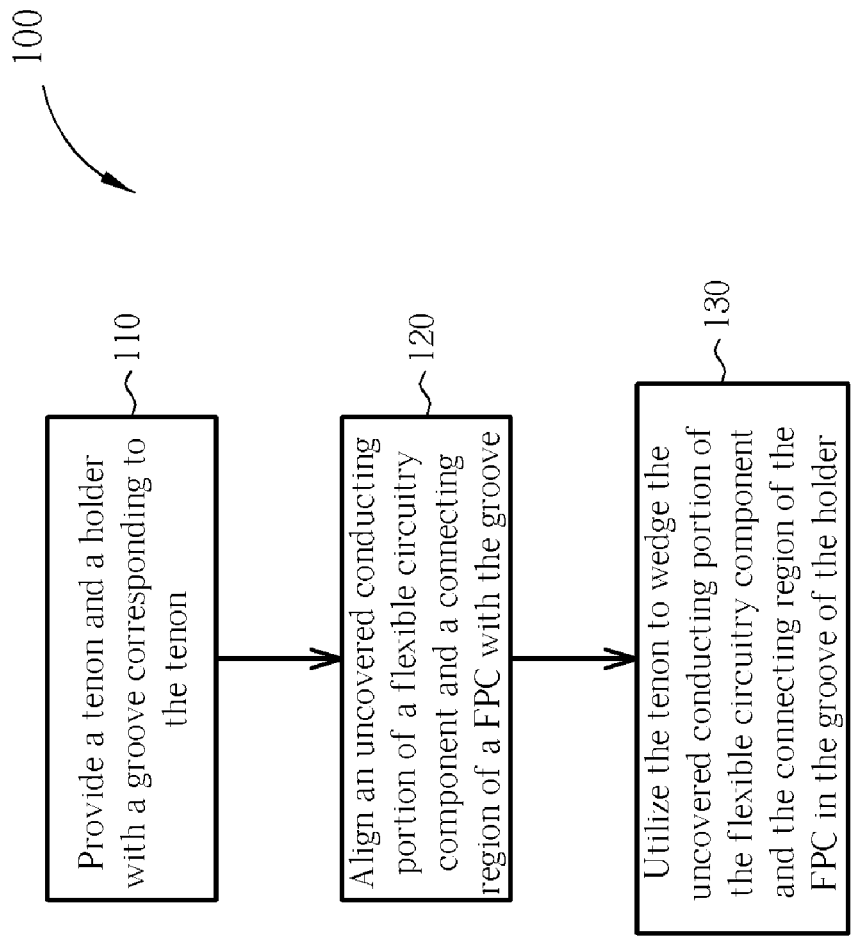
FIG. 1 is a flowchart illustrating a method for connecting a flexible printed circuit with another flexible circuitry component according to an exemplary embodiment of the present invention.

Please refer to FIG. 1, which shows a flowchart 100 illustrating a method for connecting a flexible printed circuit (FPC) with another flexible circuitry component according to an exemplary embodiment of the present invention. Note that the term "flexible circuitry component" as used herein encompasses any circuitry component that is flexible and contains conducting wires, such as a flexible flat cable (FFC), a single wire (e.g., a power line or signal line), or another flexible printed circuit. Preferably, the flexible circuitry component is flat. For the purpose of explanatory convenience in the following description, a FFC is herein taken as an embodiment of the flexible circuitry component, and the steps of the flowchart 100 will be explained with reference to a schematic diagram of a circuitry assembly 200 shown in FIG. 2. The flowchart 100 comprises following steps:

Step 110: Provide a tenon 210 and a holder 220, wherein the holder 220 is provided with a groove 222 corresponding to the tenon 210.

Step 120: Align an uncovered conducting portion 232 of a flexible circuitry component (e.g., a FFC in this embodiment) 230 and a connecting region 242 of a FPC 240 with the groove 222 of the holder 220.

Step 130: Utilize the tenon 210 to wedge the uncovered conducting portion 232 of the FFC 230 and the connecting region 242 of the FPC 240 in the groove 222 of the holder 220 to cause that the uncovered conducting portion 232 contacts the connecting region 242.

Figure 2:
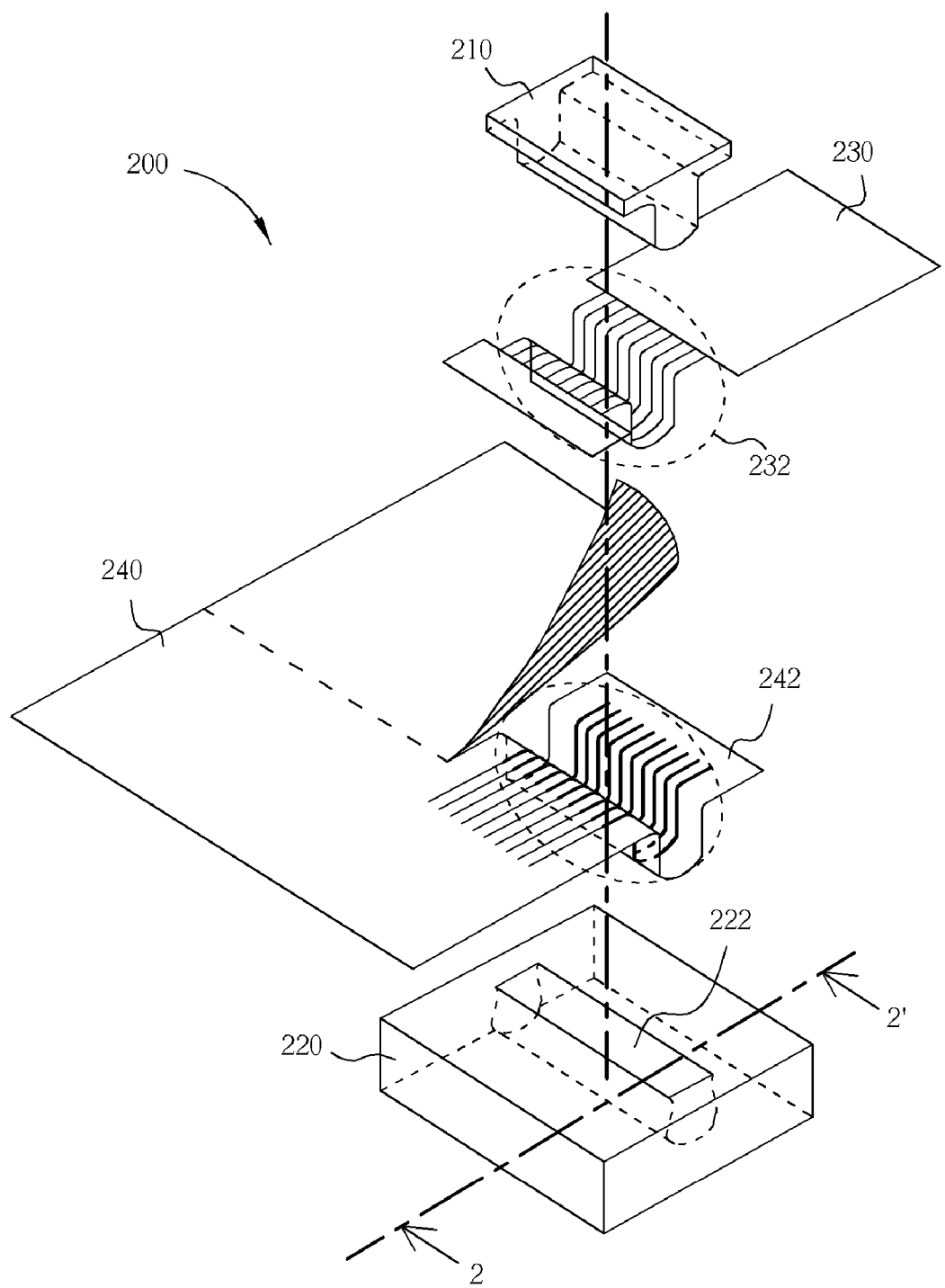
FIG. 2 is a schematic diagram of a circuitry assembly according to one embodiment of the present invention.

As shown in FIG. 2, the uncovered conducting portion 232 of the FFC 230 usually contains a plurality of conducting wires while the connecting region 242 of the FPC 240 usually comprises a plurality of conducting pads, but this is merely an embodiment rather than a restriction of the practical applications. It should be appreciated by those of ordinary skill in the art that the conducting pads of the connecting region 242 can be regarded as a form of conducting wire. Accordingly, the connecting region 242 is essentially an uncovered conducting portion of the FPC 240.

In practice, the groove 222 can be designed to have a shape matching up the tenon 210 so that the tenon 210 can engage with the holder 220 after the tenon 210 is plugged into the groove 222. In addition, the tenon 210 and/or the groove 222 (or the holder 220) may be implemented with flexible materials to increase the shearing stress between the tenon 210 and the groove 222 thereby improving the tightness of such an assembly.

In the embodiment shown in FIG. 2, the FFC 230 is positioned above the FPC 240. Thus, when the uncovered conducting portion 232 of the FFC 230 and the connecting region 242 of the FPC 240 are wedged in the groove 222 by the tenon 210 in step 130, the uncovered conducting portion 232 of the FFC 230 is sandwiched between the tenon 210 and the connecting region 242 of the FPC 240. In this embodiment, the tenon 210 may be implemented with non-conducting materials to prevent the uncovered conducting portion 232 of the FFC 230 from shorting.

Since the FFC 230 and the FPC 240 are both flexible, the positions of the tenon 210 and the holder 220 can be swapped in practical applications. That is, the tenon 210 may be arranged below the FPC 240 while the holder 220 is arranged above the FFC 230. As a result, when the uncovered conducting portion 232 of the FFC 230 and the connecting region 242 of the FPC 240 are wedged in the groove 222 by the tenon 210, the uncovered conducting portion 232 of the FFC 230 is sandwiched between the bottom of the groove 222 and the connecting region 242 of the FPC 240. In this case, the groove 222 may be implemented with non-conducting materials to prevent the uncovered conducting portion 232 of the FFC 230 from shorting. Alternatively, an insulating layer may be coated or plated on the bottom of the groove 220 so that the bottom of the groove 222 is non-conducting so as to achieve the same purpose. As can be derived from the foregoing descriptions, both the tenon 210 and the holder 220 can be implemented with non-conducting materials. For example, the tenon 210 and the holder 220 can both be made by plastics, which are flexible, non-conducting, and low cost.

Since the FPC 240 is flexible, a portion, near the connecting region 242, of the FPC 240 may deform when the connecting region 242 of the FPC 240 is wedged in the groove 222 by the tenon 210. Such a deformation of the FPC 240 may cause reversely influence to active/passive components on the FPC 240. To alleviate the influence caused by the aforementioned deformation, the connecting region 242 may be divided from other parts of the FPC 240. For example, in the embodiment shown in FIG. 2, the FPC 240 is provided with a cut that causes the connecting region 242 to be semi-independent of the other parts of the FPC 240. As a result, when the connecting region 242 is wedged in the groove 222 by the tenon 210, only the connecting region 242 and limited nearby area may deform and the other parts of the FPC 240 are not affected. In practice, the number of connecting region arranged on the FPC 240 may be extended to two or more and not limited to the number shown in the foregoing embodiment.

Figure 3:
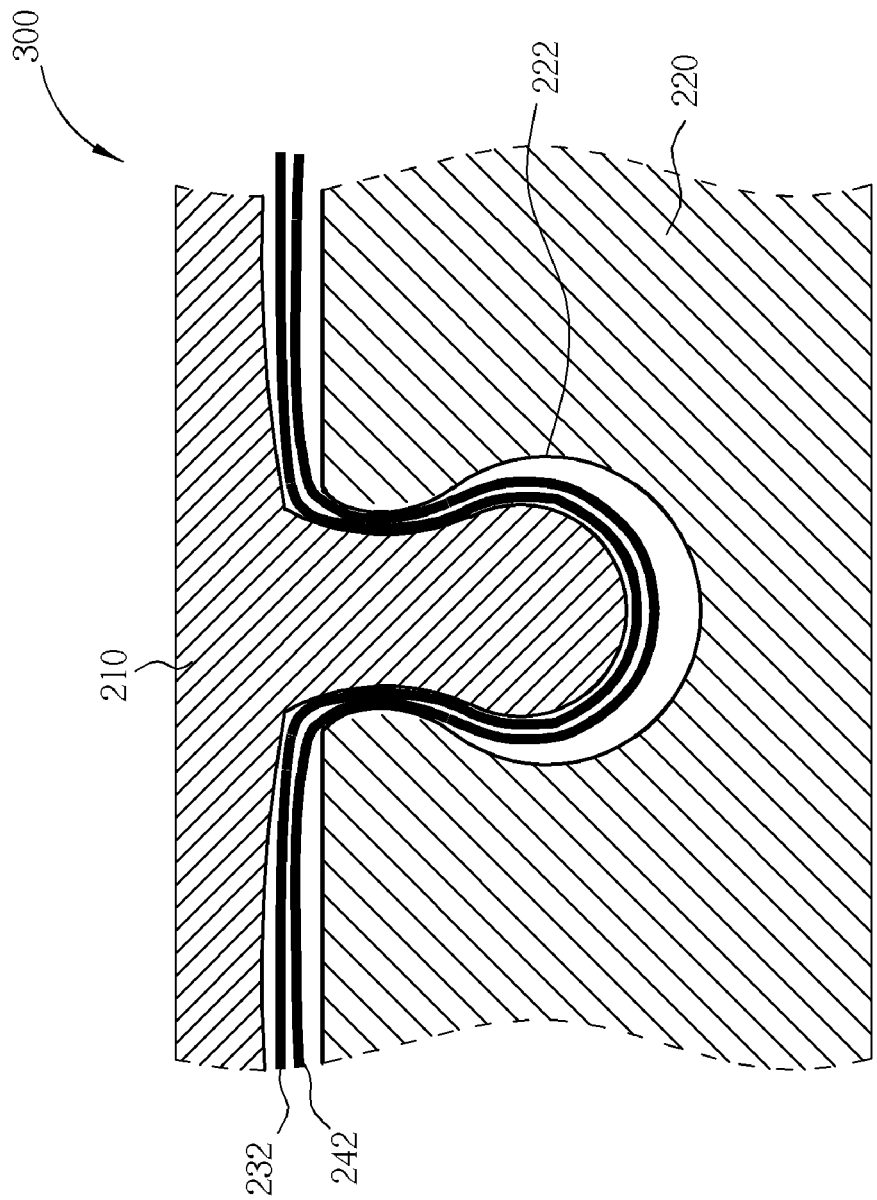
FIG. 3 is a cross-sectional view along a line 2-2' of the circuitry assembly of FIG. 2.

FIG. 3 depicts a cross-sectional view 300 along line 2-2' of the circuitry assembly 200 shown in FIG. 2. As shown in FIG. 3, when the tenon 210 is plugged into the groove 222 of the holder 220, the uncovered conducting portion 232 of the FFC 230 and the connecting region 242 of the FPC 240 are both sandwiched between the tenon 210 and the groove 222. Consequently, the uncovered conducting portion 232 of the FFC 230 and the connecting region 242 of the FPC 240 can contract to each other without using any adhesive or soldering process. In the embodiment shown in FIG. 3, the opening of the groove 222 is narrower than the bottom of the groove 222. Additionally, the volume of a first portion, which is near the bottom of the groove 222, of the tenon 210 is greater than the volume of a second portion, which is near the opening of the groove 222, of the tenon 210. Such a design is able to improve the tightness between the tenon 210 and the groove 222 when the tenon 210 is plugged into the groove 222 but this is not a restriction of the practical implementations. In addition, the allowable bending degree of both the uncovered conducting portion 232 of the FFC 230 and the connecting region 242 of the FPC 240 should be taken as a consideration in designing the shape of the tenon 210 and the groove 222 in order to prevent the uncovered conducting portion 232 or the connecting region 242 from breaking after they are wedged in the groove 222 by the tenon 210.

Furthermore, positioning mechanism can also be employed in the foregoing assembly process of the FPC and FFC to improve the convenience and accuracy of aligning the uncovered conducting portion of the FCC and the connecting region of the FPC with the groove of the holder in step 120. Hereinafter, further details are described with reference to FIG. 4.

Figure 4:
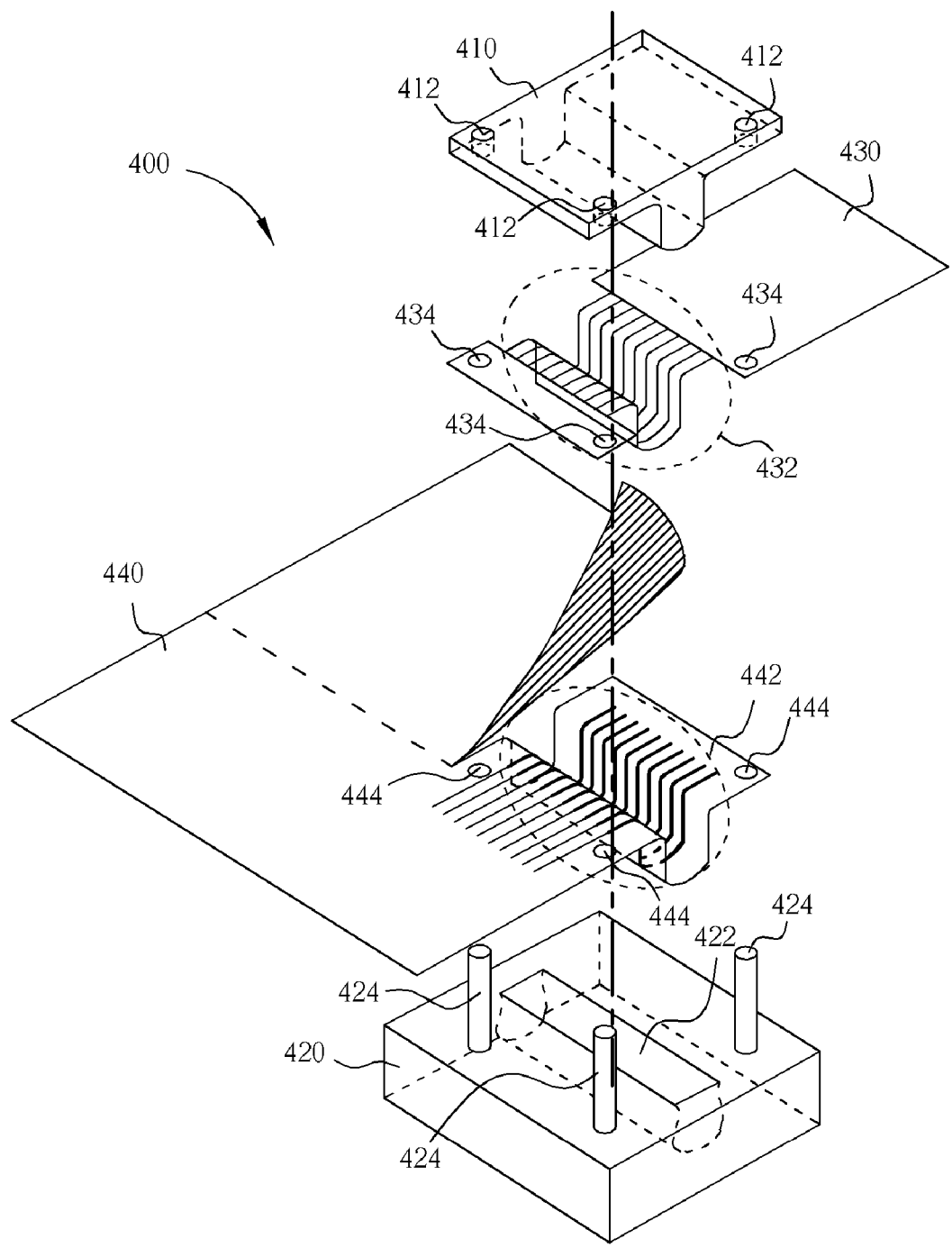
FIG. 4 is a schematic diagram of a circuitry assembly according to another embodiment of the present invention.

FIG. 4 shows a schematic diagram of a circuitry assembly 400 according to another embodiment of the present invention. In this embodiment, an uncovered conducting portion 432 of a FFC 430 and a connecting region 442 of a FPC 440 are wedged in a groove 422 of a holder 420 by a tenon 410 so that the uncovered conducting portion 432 and the connecting region 442 contact with each other. Differing from the aforementioned embodiments, the tenon 410 of this embodiment is provided with a plurality of positioning holes 412; the FFC 430 is provided with a plurality of positioning holes 434; the FPC 440 is provided with a plurality of positioning holes 444; and the holder 420 is provided with a plurality of positioning sticks 424 corresponding to those positioning holes.

As shown, the opposite sides of the uncovered conducting portion 432 of the FFC 430 have different number of positioning holes, and the opposite sides of the connecting region 442 of the FPC 440 also have different number of positioning holes, too. Those positioning holes and positioning sticks form a positioning mechanism that can correctly align both the uncovered conducting portion 432 of the FFC 430 and the connecting region 442 of the FPC 440 with the groove 422 of the holder 420. Additionally, such a positioning mechanism can also prevent the uncovered conducting portion 432 and the connecting region 442 from being assembled with incorrect allocation. In other words, the disclosed positioning mechanism also functions as a fool-proof mechanism.

Please note that the location and number of the aforementioned positioning holes and positioning sticks are not limited to a specific combination. In addition, the positioning mechanism for aligning the uncovered conducting portion 432 with the connecting region 442 is not limited to the combination of the positioning holes and positioning sticks. For example, the positioning holes and positioning sticks may be replaced by symbols, stripes, colors, or other marks that are obvious and easily to understand.

In contrast to the prior art, the contacting methods disclosed by the present invention are able to contact a FPC with a FFC or any other flexible circuitry components without using the hot bar soldering process. As a result, the manufacturing cost can be significantly reduced while improving the yield rate of the assembly processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for connecting a flexible printed circuit (FPC) with a flexible circuitry component containing conducting wires in which the conducting wires having an uncovered conducting portion, the method comprising:

providing a tenon and a holder with a groove corresponding to the tenon;

forming a plurality of first positioning elements on the tenon;

forming a plurality of second positioning elements on the holder;

forming a plurality of third positioning elements on the FPC;

forming a plurality of fourth positioning elements on the flexible circuitry component, wherein the third positioning elements on the FPC and the fourth positioning elements on the flexible circuitry component are not formed due to the tenon and the holder;

utilizing the first, second, third, and fourth positioning elements to align both the uncovered conducting portion of the flexible circuitry component and a connecting region of the FPC with the groove in the holder; and utilizing the tenon to wedge the uncovered conducting portion of the flexible circuitry component and the connecting region of the FPC in the groove of the holder to cause that the uncovered conducting portion contacts the connecting region.

2. The method of claim 1, wherein the tenon is flexible.

3. The method of claim 1, wherein the groove is flexible.

4. The method of claim 1, wherein the uncovered conducting portion of the flexible circuitry component is sandwiched between the tenon and the connecting region of the FPC when the tenon is wedged in the groove.

5. The method of claim 4, wherein the tenon is non-conducting.

6. The method of claim 1, wherein the uncovered conducting portion of the flexible circuitry component is sandwiched between the bottom of the groove and the connecting region of the FPC when the tenon is wedged in the groove.

7. The method of claim 6, wherein the bottom of the groove is non-conducting.

8. The method of claim 1, wherein the flexible circuitry component is a flexible flat cable (FFC), a single wire, or another flexible printed circuit.

9. The method of claim 1, wherein the step of arranging a plurality of positioning mechanisms further arranging at least one positioning mechanism on the tenon or the holder.

10. The method of claim 1, wherein the second positioning elements are disposed on the holder in an asymmetric fashion such that a number of positioning elements disposed at one side of the groove is different from a number of positioning elements disposed at the other side of the groove, the first positioning elements are arranged on the tenon in the asymmetric fashion, the third positioning elements are arranged on the FPC in the asymmetric fashion, and the fourth positioning elements are arranged on the flexible circuitry component in the asymmetric fashion.

11. A circuitry assembly comprising:
a holder with a groove;
a tenon being plugged into the groove;
a flexible printed circuit (FPC) comprising a connecting region;
a flexible circuitry component containing conducting wires in which the conducting wires having an uncovered conducting portion; and
a plurality of positioning elements, for aligning both the uncovered conducting portion and the connecting region with the groove, the positioning mechanisms comprising:
a plurality of first positioning elements formed on the tenon;
a plurality of second positioning elements formed on the holder;
a plurality of third positioning elements formed on the FPC; and
a plurality of fourth positioning elements formed on the flexible circuitry component;
wherein the third positioning elements on the FPC and the fourth positioning elements on the flexible circuitry component are not formed due to the tenon and the holder, and the uncovered conducting portion and the connecting region of the FPC are sandwiched between the tenon and the groove to contact with each other.

12. The circuitry assembly of claim 11, wherein at least one of the tenon and the groove is flexible.

13. The circuitry assembly of claim 11, wherein the uncovered conducting portion of the flexible circuitry component is sandwiched between the tenon and the connecting region of the FPC.

14. The circuitry assembly of claim 13, wherein the tenon is non-conducting.

15. The circuitry assembly of claim 11, wherein the uncovered conducting portion of the flexible circuitry component is sandwiched between the bottom of the groove and the connecting region of the FPC.

16. The circuitry assembly of claim 15, wherein the bottom of the groove is non-conducting.

17. The circuitry assembly of claim 11, wherein the flexible circuitry component is flat.

18. The circuitry assembly of claim 17, wherein the flexible circuitry component is a flexible flat cable (FFC), a single wire, or another flexible printed circuit.

19. The circuitry assembly of claim 11, wherein the opening of the groove is narrower than the bottom of the groove.

20. The circuitry assembly of claim 11, wherein the volume of a first portion, which is near the bottom of the groove, of the tenon is greater than the volume of a second portion, which is near the opening of the groove, of the tenon.

21. The circuitry assembly of claim 11, further comprising:
at least one positioning mechanism, arranged on the holder or the tenon, for aligning the uncovered conducting portion and the connecting region with the groove.

22. The circuitry assembly of claim 11, wherein the second positioning elements are disposed on the holder in an asymmetric fashion such that a number of positioning elements disposed at one side of the groove is different from a number of positioning elements disposed at the other side of the groove, the first positioning elements are arranged on the tenon in the asymmetric fashion, the third positioning elements are arranged on the FPC in the asymmetric fashion, and the fourth positioning elements are arranged on the flexible circuitry component in the asymmetric fashion.

23. A method for connecting a flexible printed circuit (FPC) with a flexible circuitry component containing conducting wires in which the conducting wires having an uncovered conducting portion, the method comprising:
providing a tenon and a holder with a groove corresponding to the tenon;
cutting the FPC to make a cut between a connecting region of the FPC and other parts of the FPC, thereby making the connecting region of the FPC semi-independent of the other parts of the FPC, wherein the cut does not completely separate the connecting region of the FPC from the other parts of the FPC; and
utilizing the tenon to wedge the uncovered conducting portion of the flexible circuitry component and the connecting region of the FPC in the groove of the holder to cause that the uncovered conducting portion contacts the connecting region.

24. A circuitry assembly comprising:
a holder with a groove;
a tenon being plugged into the groove;
a flexible printed circuit (FPC) comprising a connecting region, wherein the FPC is provided with a cut between the connecting region of the FPC and other parts of the FPC to thereby make the connecting region semi-independent of the other parts of the FPC, and the cut does not completely separate the connecting region of the FPC from the other parts of the FPC; and a flexible circuitry component containing conducting wires in which the conducting wires having an uncovered conducting portion;

wherein the uncovered conducting portion and the connecting region of the FPC being sandwiched between the tenon and the groove to contact with each other.

* * * * *